United States Patent
Vitrano et al.

(10) Patent No.: US 9,722,526 B2
(45) Date of Patent: Aug. 1, 2017

(54) MODULAR MOTOR DRIVE COMMUNICATION SYSTEM AND METHOD

(71) Applicant: ROCKWELL AUTOMATION TECHNOLOGIES, INC., Mayfield Heights, OH (US)

(72) Inventors: James B. Vitrano, South Milwaukee, WI (US); August B. Schrab, Saukville, WI (US); Daniel J. Middlestetter, Lyndhurst, OH (US); John James Jenks, Rocky River, OH (US); Kurt R. Hohensee, Germantown, WI (US); Jimmy See Yong Koh, Singapore (SG); Teck Siang Tan, Singapore (SG)

(73) Assignee: Rockwell Automation Technologies, Inc., Mayfield Heights, OH (US)

(*) Notice: Subject to any disclaimer, the term of this patent is extended or adjusted under 35 U.S.C. 154(b) by 108 days.

(21) Appl. No.: 14/632,076

(22) Filed: Feb. 26, 2015

(65) Prior Publication Data
US 2015/0249420 A1    Sep. 3, 2015

Related U.S. Application Data

(60) Provisional application No. 61/946,408, filed on Feb. 28, 2014.

(51) Int. Cl.
*H02P 1/00* (2006.01)
*H02P 25/16* (2006.01)
(Continued)

(52) U.S. Cl.
CPC .............. *H02P 25/16* (2013.01); *H02P 27/04* (2013.01); *H05K 7/1432* (2013.01)

(58) Field of Classification Search
CPC .... H02M 7/003; H02M 7/4826; H02M 7/539; H02P 27/04; H02P 25/14; H02P 27/06; H02P 25/16; H02P 6/28; H02K 11/0094
(Continued)

(56) References Cited

U.S. PATENT DOCUMENTS

| | | | | |
|---|---|---|---|---|
| 5,903,117 A * | 5/1999 | Gregory | .................... | H02P 6/30 318/400.09 |
| 6,984,950 B2 * | 1/2006 | Jonsson | .................... | H02P 1/26 318/268 |

(Continued)

FOREIGN PATENT DOCUMENTS

| EP | 0994559 A2 | 4/2000 |
|---|---|---|
| EP | 1134882 A2 | 9/2001 |

(Continued)

OTHER PUBLICATIONS

Extended European Search Report for EP Application No. 15156989 Mailed Apr. 7, 2016; 9 Pages.
(Continued)

*Primary Examiner* — Bentsu Ro
*Assistant Examiner* — Thai Dinh
(74) *Attorney, Agent, or Firm* — Fletcher Yoder P.C.

(57) ABSTRACT

A motor drive system includes a control module and a power module for generating control signals and power signals, respectively, for driving an electric motor. An add-on module or subassembly is physically positionable between the control and power modules, and communicates with the control module to allow for communication with external devices.

20 Claims, 11 Drawing Sheets

(51) Int. Cl.
*H02P 27/04* (2016.01)
*H05K 7/14* (2006.01)

(58) Field of Classification Search
USPC ............................. 318/494, 727, 767, 772
See application file for complete search history.

(56) References Cited

U.S. PATENT DOCUMENTS

| | | | | |
|---|---|---|---|---|
| 7,342,371 | B2* | 3/2008 | Zuzuly | B66B 1/24 187/247 |
| 7,668,605 | B2* | 2/2010 | Braun | G05B 19/4185 700/17 |
| 8,355,821 | B2* | 1/2013 | Rustad | H02P 23/0077 700/1 |
| 8,482,240 | B2* | 7/2013 | El-Ibiary | H02P 5/00 318/400.09 |
| 9,071,189 | B2* | 6/2015 | Middlestetter | H02P 31/00 |
| 2003/0201740 | A1 | 10/2003 | Katsu et al. | |
| 2006/0136622 | A1* | 6/2006 | Rouvelin | H05K 5/0021 710/62 |
| 2007/0185969 | A1* | 8/2007 | Davis | G05B 19/4185 709/216 |
| 2012/0221155 | A1* | 8/2012 | Miles | G05B 19/0423 700/286 |
| 2014/0009896 | A1 | 1/2014 | Nikola et al. | |

FOREIGN PATENT DOCUMENTS

| | | | | |
|---|---|---|---|---|
| FI | EP1134882 A9 * | 2/2002 | | H02M 7/003 |
| WO | 2007048003 A2 | 4/2007 | | |
| WO | 2007055574 A1 | 5/2007 | | |

OTHER PUBLICATIONS

Extended European Search Report for EP Application No. 15156993 Mailed Apr. 26, 2016; 10 Pages.

* cited by examiner

MODULAR MOTOR DRIVE COMMUNICATION SYSTEM AND METHOD

CROSS REFERENCE TO RELATED APPLICATIONS

This application claims priority from and the benefit of U.S. Provisional Application Ser. No. 61/946,408, entitled "MODULAR MOTOR DRIVE COMMUNICATION SYSTEM AND METHOD", filed Feb. 28, 2014, which is hereby incorporated by reference in its entirety.

BACKGROUND

The present invention relates generally to drive systems for powering electric motors, and more particularly to a modular drive system designed and adapted for controlling motors of various sizes and ratings.

A myriad of applications exist in industry for electric motors of various types. In many applications, induction motors are driven to rotate loads, such as pumps, fans, and conveyors, to mention only a few. Other types of motors may similarly be driven. A load may call for uniform speed and torque throughout its life, although many applications require much more flexible control. That is, a motor may need to be driven at different speeds and with different torques at different stages in its operation. To accommodate such needs, variable speed motor drives have been developed that allow for output waveforms of varying and controllable frequency, capable of correspondingly varying the speeds of driven motors. Similarly, equipment has been developed for soft starting motors, starting and stopping motors in controlled manners, and so forth. Such motor drives are now ubiquitous throughout industrial, commercial, shipping, material handling, and other applications.

In general, motor drives are designed to provide good service life in a range of conditions and with a range of loads. The drives may be designed around a single package that can be programmed and wired to receive input power as well as to output conditioned power to the electric motor. Such packaged products typically include power conditioning circuitry that receives alternating current (AC) input and converts the AC input to a direct current (DC) form, before reconverting the DC power to controlled frequency AC output. Various operator interfaces and programming platforms may also be provided, as well as networking capabilities.

One particular challenge that arises in such products is the design for various motor sizes, for facilitating programming, for sharing programming and control parameters, and so forth. Most such products have been designed to power specific sizes of motors (typically rated by the power output or frame size), and the user must select and program the appropriate product for the particular motor to be powered. All of the circuitry used to control power electronic devices within the drives has typically been included in the single package. Programming has been done either manually or by an interface with a configuration computer or network connected to the unitary package. This product paradigm, however, suffers from drawbacks including limitations of installation and configuration of the drives, relatively inefficient use of control platforms between drives, in accessibility of the programming once the drive is commissioned, or, conversely, risks of access to the drives from exterior sources due to resident network connections.

One novel approach now being taken for motor drives involves design and construction of "modules" that are interfaced to provide the desired control and power. In some such designs, control modules or sub-assemblies are paired with power modules or sub-assemblies, with communication between the two, once interconnected, to provide the desired control signals for the power components, and to provide feedback for the control components. Some designs incorporate native or integrated communications circuits that allow for communication with external or remote devices, such as for programming the drives, altering settings, monitoring operation, or communication and coordination with other drives. However, such designs generally do not allow for retrofitting or optional incorporation of such communications hardware, firmware or software.

There is a need, therefore, for improved techniques for driving electric motors that can respond to such drawbacks.

BRIEF DESCRIPTION

The present disclosure sets forth a motor drive system including a modular power subassembly controllable to provide controlled frequency AC power to an electric motor, and a modular control subassembly separable from the power subassembly control circuitry that, in operation, applies control signals to the power subassembly for controlling the provided power. An add-on subassembly is positionable physically between the power subassembly and the control subassembly and electrically coupled to the control subassembly for providing communication between the control subassembly and at least one external device.

The disclosure also sets forth a motor drive system including a communication subassembly configured to be positioned between a control subassembly and a power subassembly of the motor drive system. The communication subassembly is electrically coupled to the control subassembly and provides communication between the control subassembly and external devices.

Further, in one embodiment, a motor drive system includes a modular power subassembly controllable to provide controlled frequency alternating current power to an electric motor, and a modular control subassembly separable from the power subassembly and that, in operation, applies control signals to the power subassembly for controlling the provided power via a first mating connector of the modular power subassembly connected to a second mating connector of the modular control subassembly. A communication subassembly is only physically coupled and electrically coupled to the control subassembly for providing communication between the control subassembly and at least one external device. The communication subassembly is configured to fit around the mated first and second mating connectors when the modular control assembly and the modular power subassembly are attached so that the communication subassembly is positioned between the modular control subassembly and the modular power subassembly.

DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

The modular motor drive, and communications circuitry and functionality may be generally based upon certain existing designs, such as those set forth in U.S. patent application Ser. No. 13/727,209, entitled "Modular Motor Drive System and Method," filed on Dec. 26, 2012 by Tio et al., which is hereby incorporated into the present disclosure by reference. The present disclosure relates to what may be interchangeably referred to as an add-on device, optional device, comm option, option card, option, or communication sub-assembly that can be used in conjunction with such modular motor drives. The device may, in certain embodiments, be "sandwiched" between the control and power modules, and may include one or more processors, memory, and interface circuitry to allow for communication between the external device or devices (via a network) and the circuitry of the control module. That is, the add-on device, in some embodiments, may include a communication device to enable communication between the drive and external devices. Such communication may follow any desired protocol, such as high speed drive serial interface (HSDSI), DeviceNet, EtherNet/IP, Modbus, and so forth.

Figure 1:
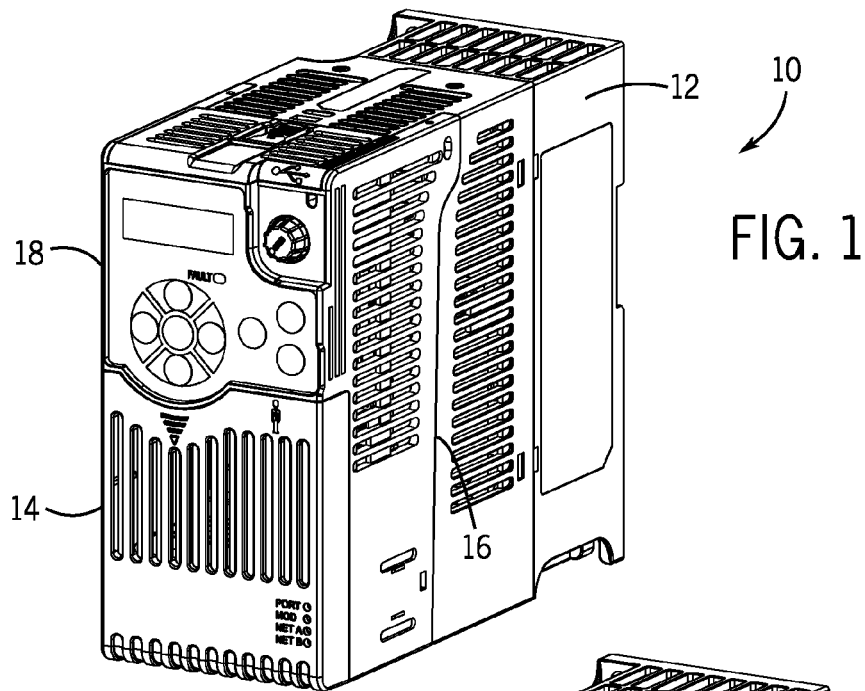
FIG. 1 is a perspective view of an exemplary motor drive system in accordance with aspects of the present techniques.

An exemplary motor drive system 10 designed to power an electric motor, such as an induction motor, is illustrated in FIG. 1. The motor drive system 10 essentially consists of a power sub-assembly 12 and a control sub-assembly 14 which is designed to be secured to and attached to the power sub-assembly during operation. In some embodiments, as discussed in detail below, an add-on device, such as a communication sub-assembly, is installed between the power sub-assembly 12 and the control sub-assembly 14. A mechanical interface 16 allows for mating of the sub-assemblies and the sub-assemblies may be held together in various manners, such as via snaps, fasteners, and the like. However, in a presently contemplated embodiment, the control sub-assembly 14 and the power sub-assembly 12 are physically configured to allow the control sub-assembly 14 to be secured to the power sub-assembly 12 via interfacing surfaces, such that the control sub-assembly 14 may be attached and detached from the power sub-assembly 12 by hand and without the use of tools. This ability to toollessly attach and detach the control sub-assembly 14 greatly facilitates programming, reprogramming, commissioning and servicing of the system. An operator interface 18 is shown on a front face of the control sub-assembly 14 and may allow for certain user interactions with the drive, such as to view configuration parameters, alter configuration parameters, view logs, history, error and other codes, view certain operational parameters (e.g., currents, voltages, speeds), network configuration, and so forth. In a present embodiment, the operator interface comprises an LCD module that supports multiple languages, and is able to display parameter codes followed by dynamic descriptions.

Figure 2:
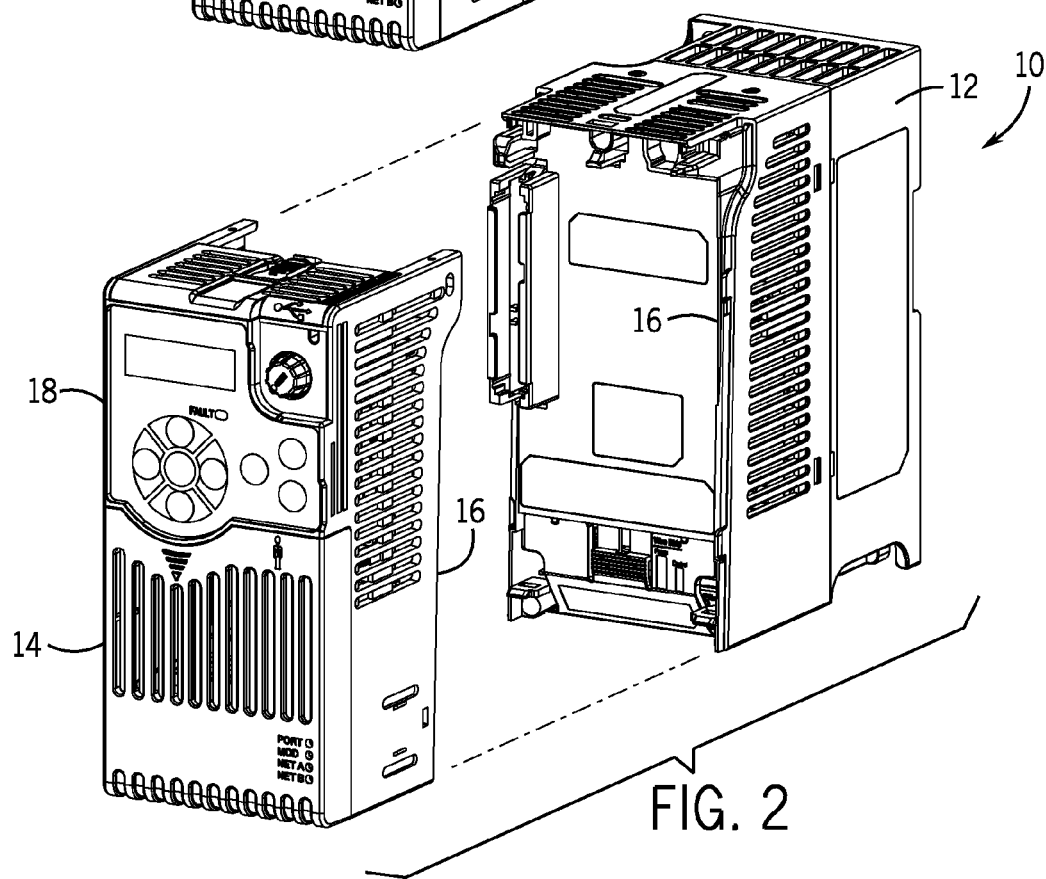
FIG. 2 is a similar perspective view of the system of FIG. 1 with a control sub-assembly removed from a power sub-assembly.

As shown in FIG. 2, the control sub-assembly 14 is removable from the power sub-assembly 12, such as for configuration (programming), servicing, and so forth. The control sub-assembly 14 may be removed from the power sub-assembly 12 without disconnecting the power sub-assembly 12 from either the power supply (e.g., upstream power circuitry) or from the electric motor once placed in service. Also, the communication sub-assembly may be installed and/or removed easily for configuration, servicing, and the like by removing the control sub-assembly 14 from the power sub-assembly 12. However, in some embodiments, when installing the communication sub-assembly, the power supply may be disconnected from the power sub-assembly 12.

Figure 3:
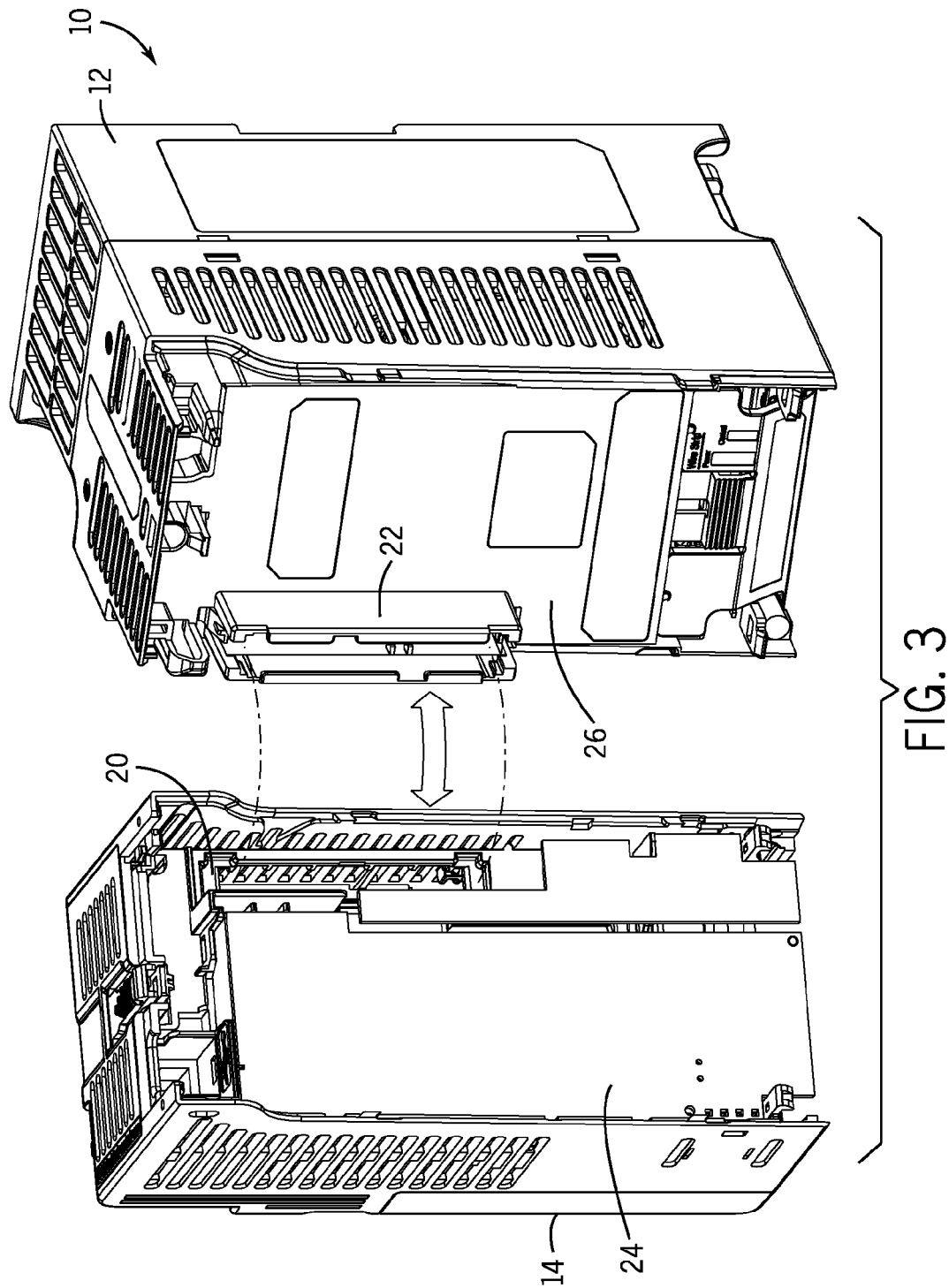
FIG. 3 is a perspective view of the control sub-assembly and power sub-assembly illustrating internal plug-in connectors for mating the two and for the exchange of signals between the two.

In one presently contemplated embodiment, multi-conductor connectors mate when the control sub-assembly is mounted on or attached to the power sub-assembly. FIG. 3 illustrates the control sub-assembly 14 removed from the power sub-assembly 12, and shows the multi-conductor connectors 20 and 22 that interface with one another when the two sub-assemblies are brought together to transfer power and data between the control sub-assembly 14 and the power sub-assembly 12. That is, in one presently contemplated embodiment, the control sub-assembly 14 does not contain the means for supplying its own power (e.g., a battery), but receives power from the power sub-assembly 12 when the two are connected. Moreover, the control sub-assembly 14 performs all computations, implements all control routines, and generates all control signals that are applied to the power circuitry within the power sub-assembly 12 (as described more fully below) via the multi-conductor connectors. The connectors 20 and 22 are provided on sides of the control sub-assembly 14 and power sub-assembly 12 that face one another and are exposed only when the sub-assemblies are separated, as indicated by reference numerals 24 and 26. That is, the facing sides are not accessible when the two sub-assemblies are mated.

Figure 4:
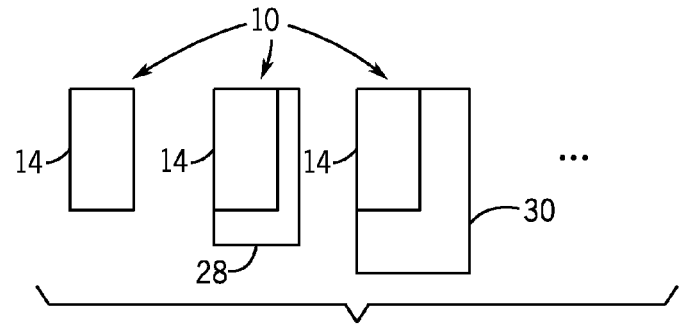
FIG. 4 is an exemplary illustration of how the same control sub-assembly may be used with different power sub-assemblies having different ratings.

Although FIGS. 1-3 illustrate a control sub-assembly 14 that is generally co-extensive with the power sub-assembly 12, it is presently contemplated that the same control sub-assembly 14 may serve to accommodate various power sub-assemblies that increase in both size and rating. FIG. 4 illustrates three such arrangements. In the first, the control sub-assembly 14 is shown over a power sub-assembly 12 which is located behind the control sub-assembly 14, the two sub-assemblies being generally co-extensive with one another. As indicated by reference numerals 28 and 30, however, power sub-assemblies of larger sizes and ratings may be coupled to the same control sub-assembly 14. The power sub-assemblies mate and interface in similar manners, and the circuitry within the control sub-assembly is designed to allow for motors of various sizes to be driven without altering the hardware or circuitry within the control sub-assembly. Such larger sizes are accommodated only by configuration changes within the control sub-assembly 14. In presently contemplated embodiments, for example, power sub-sections having ratings of 0.4 to 22 kW/0.5 to 30 hp at 400/480V, with global voltage classes of 110V, 200V, 400V and 600V may be accommodated by the same control sub-assembly 14. However, other sizes and ratings may, of course, be envisaged.

In accordance with presently contemplated embodiments, the power sub-assembly comprises power electronic devices (e.g., switches) that regulate the conversion of power from a power source to controlled frequency AC output for driving the electric motor. The control sub-assembly, on the other hand, comprises processing capabilities, motor control routines, parameters utilized by the routines for motor control, operator interface circuitry, and so forth to provide control signals for the power electronics of the power sub-assembly. The control signals are applied to the circuitry within the power sub-assembly based on the motor control routines and any further processing in the power sub-assembly converts these control signals to timing signals for driving the gates of power electronic switches within the power sub-assembly. The communication sub-assembly may include one or more processors, memory, and interface circuitry to allow for communication between the external device or devices (via a network) and the circuitry of the control sub-assembly 14.

Figure 5:
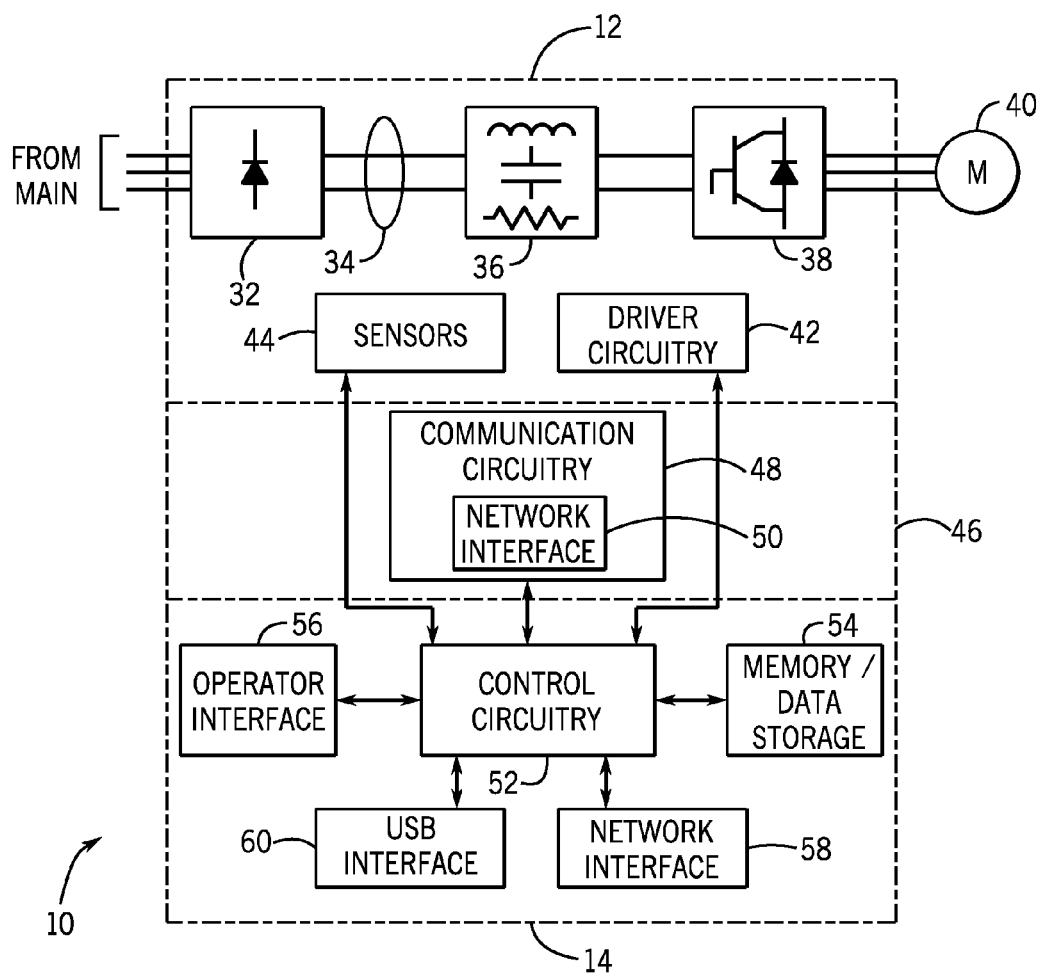
FIG. 5 is a diagrammatical representation of certain of the functional circuitry contained in the power sub-assembly, control sub-assembly, and a communication sub-assembly in a modified motor drive.

This general topology is illustrated diagrammatically in FIG. 5. As shown in FIG. 5, the power sub-assembly 12 is designed to receive power from a power grid or main, or more generally from an input power supply. The power will typically be applied by conductors or busses, and the drive system may be, where desired, mounted near or remote from an electric motor that is driven by the system in operation. In certain embodiments and installations, the motor drive system 10 may be rigidly mounted in a cabinet, on rails, or in any suitable manner. The incoming power may conform to various standards, depending upon the country or region in which the system is utilized, but will typically provide single or three-phase input power that is applied to a rectifier circuit 32.

The rectifier circuitry 32 may be passive or active, and where desired may allow for regenerated power to be applied back to the power source (e.g., during deceleration or braking of the load). The rectifier circuit 32 produces DC output that is applied to a DC bus 34. Various conditioning and support circuitry, illustrated generally by reference numeral 36 may be connected to the DC bus 34. As will be appreciated by those skilled in the art, such circuitry 36 may include inductors, capacitors, resistors, and so forth. In general, inductors and capacitors may be utilized to store energy in the DC bus 34, and to smooth variations or ripple in the DC power, as well as to supply energy during certain periods of operation. Resistors may be provided for braking or dissipating energy, and so forth. DC power from the DC bus 34 is applied to an inverter circuit 38, or more generally to a power converter circuit.

The inverter circuit 38 will typically include pairs of power electronic switches, such as insulated gate bipolar transistors (IGBTs) associated with diodes. These power electronic switches are driven to allow power to be drawn from the DC bus to form a synthetic sinusoidal output of a controlled frequency. The output power is then applied to an electric motor 40. While in many applications the drive system is configured to drive single or multi-phase AC motors, it should be noted that the drive system may be adapted for driving different motor types, such as permanent magnet motors.

In the illustration of FIG. 5, the power sub-assembly 12 also includes driver circuitry 42. The driver circuitry 42 acts based upon control signals received from the control sub-assembly to generate gate drive signals that are applied to the power electronic switches of the inverter circuitry 38. Where a switched rectifier is provided, such driver circuitry, or a separate circuit may similarly apply signals to the rectifier. The driver circuitry 42 may base the timing of the gate drive signals upon any desired algorithm, such as utilizing triangular carrier waves and other techniques generally known in the art. Finally, the power sub-assembly 12 may include various sensors, indicated collectively by the reference numeral 44, that detect feedback parameters, such as voltages, currents, position (electric motor) and so forth during operation. Signals to and from the driver circuitry 42 and from the sensors 44 are provided to the control sub-assembly via the multi-conductor connectors discussed above.

As illustrated, the communication sub-assembly 46, mentioned above, is installed between the power sub-assembly 12 and the control sub-assembly 14. In accordance with certain aspects of the present disclosure, the communication sub-assembly 46 includes programmed and operative communication circuitry 48. As illustrated, the communication circuitry 48 directly interfaces and communicates data to the control circuitry 52 of the control sub-assembly 14. The communication circuitry 48 generally includes one or more digital and/or analog circuits, processors, memories, interfaces, firmware, and/or software configurations. For example, the communication circuitry 48 may include a network interface 50 that allows for improved communication between the control sub-assembly 14 and any connected (networked) devices, such as external control and/or monitoring equipment, other drives, and so forth. The network interface 50 may include an Ethernet interface and be configured to communicate via various industrial data exchange protocol interfaces (EtherNet/IP, DeviceNet, Modbus, Profibus, ControlNet).

In some embodiments, the network interface 50 of the communication circuitry 48 included in the communication sub-assembly, or optional communications device (referred to as "comm option" herein), may implement a high speed drive serial interface (HSDSI) that provides communication between the control circuitry 52 and any external devices. Such comm options may utilize an HSDSI protocol that allows for improved performance and reliability. In accordance with this disclosure, and discussed in more detail below, enhancements to the protocol include altering the packet format, improved message sequencing, and improved communication failure handling. Additionally or alternatively, the network interface 50 may implement a parallel interface (e.g., shared memory) that facilitates the communication of data.

The control sub-assembly 14 as illustrated in FIG. 5 comprises control circuitry 52 designed to implement one or more motor control routines based upon programmed parameters stored within the control sub-assembly 14. The control circuitry 52 may comprise any suitable processor or multiple processors, including micro-processors, field programmable gate arrays, dedicated application specific integrated circuits, and so forth. Memory circuitry, indicated generally by reference numeral 54 is associated with the control circuitry 52 and allows for storage of motor control routines, parameters referred to by the routines, as well as a vast array of other information that may be useful for controlling and monitoring the motor 40.

An operator interface 56 is further coupled to the control circuitry 52 to allow for access to certain parameters, for alteration of programming and parameters, and so forth, such as via the operator interface 18 illustrated in FIG. 1. One or more network interfaces 58 may be provided for similarly accessing certain information from the drive system. Such interfaces may include an Ethernet interface or various industrial data exchange protocol interfaces (e.g., DeviceNet, ControlNet, Profibus, Modbus, etc.). Ethernet capability allows the drive system to be integrated into an EtherNet/IP infrastructure, and the use of a dual port Ethernet card may permit connectivity options such as device level ring networking. It should be noted that, in some embodiments, the network interface 50 of the communication sub-assembly 46 enables enhanced protocols (e.g., HSDSI) to be used that improved communication with the control circuitry 52 over using the network interface 58 embedded within the control sub-assembly 14.

In accordance with this disclosure, the HSDSI protocol used may includes an altered packet format, improved message sequence, and improved communication failure handling. For example, an advantage of the improved HSDSI protocol is to convert the physical high-speed serial channel into two logical channels, one for control data and one for messaging data. This split allows control to continue being updated while a message transaction is being processed. Devices can always use the most recent or "freshest" control data that the devices receive (assuming the packet passes the CRC check and the control valid bits indicate that the control data is valid). Messaging is also simplified, with a change in the sequence number in the messaging data indicating a new message. This provides efficient notification of a new messaging request, easy matching of requests and responses, and a built-in retry from CRC failures or other communication errors, as discussed in detail below.

Technical advantages of the HSDSI protocol are independent control and messaging, utilizing direct memory access (DMA), sequence count based messaging, flexibility between multiple industrial protocols such as EtherNet/IP, Modbus, DeviceNet and Profibus, and is compatible with both single and multi-drive operation, as discussed below. Independent control and messaging refers to how the protocol places control data (drive I/O) separate from messaging data, as opposed to approaches that might utilize messages that contain both in the same package. This is an advantage because drives often process messaging data differently than control data. Decoupling control from messaging allows both sides of the protocol to deal with control data quickly and messaging data when there is time. HSDSI overcomes the limitation of forcing control updates to be only as fast as a device could process both the message and the control because of independent messaging and control. The packet format and timing are optimized to take advantage of a DMA channel present on many microprocessors. The DMA channel allows data to be sent and/or received in the background, minimizing the amount of time the processor must spend handling communication. A fixed packet size is used to allow the DMA channel to be pre-configured to receive the entire packet. Timing requirements are also in place to allow one DMA channel to switch between handling the transmission and receiving sides of the protocol.

Messaging is accomplished using a mechanism that repeats the most recent message transmission along with a sequence number to allow the other side to detect an updated message. If the receiver cannot process another message immediately, it can process the message on another future reception. Timeout, retry, and reset mechanisms are available to re-synchronize the devices on the interface if messaging communications break down. HSDSI can be translated to and from EtherNet/IP, DeviceNet, Modbus, Profibus and other digital serial interface (DSI) protocols. The upstream network communicates with an add-on device (communication sub-assembly 46) supporting one of the above protocols, which the add-on device may convert to HSDSI to communicate with the drive. It should be noted that the term "drive" and control sub-assembly 14 may be used interchangeably herein. The drive may then end up using that information to communicate with a device on the DSI bus such as a HIM, serial interface or multi-drive slave. The drive transmits packets only in response to packets received from the communication sub-assembly 46. Low-level and high-level timeouts attempt to allow orderly recovery from communication errors.

Returning to the components of the control sub-assembly, a universal serial bus (USB) interface 60 is provided in the illustrated embodiment. While one or more of these interfaces may be accessible from outside the drive system when assembled, in a presently contemplated embodiment the network interfaces 58 are accessible when the control sub-assembly is mounted on the power sub-assembly, while the USB interface, which allows for file transfer and configuration of the drive system, is not accessible unless the control sub-assembly is removed from the power sub-assembly. Where desired, the drive system may be protected by the use of passwords or other security devices.

FIGS. 6-10 illustrate the installation process and/or retrofitting process to include the add-on device (e.g., communication sub-assembly 46) in the motor drive system 10. As previously discussed, the add-on device may enable communication between the control sub-assembly 13 and at least one external device.

Figure 6:
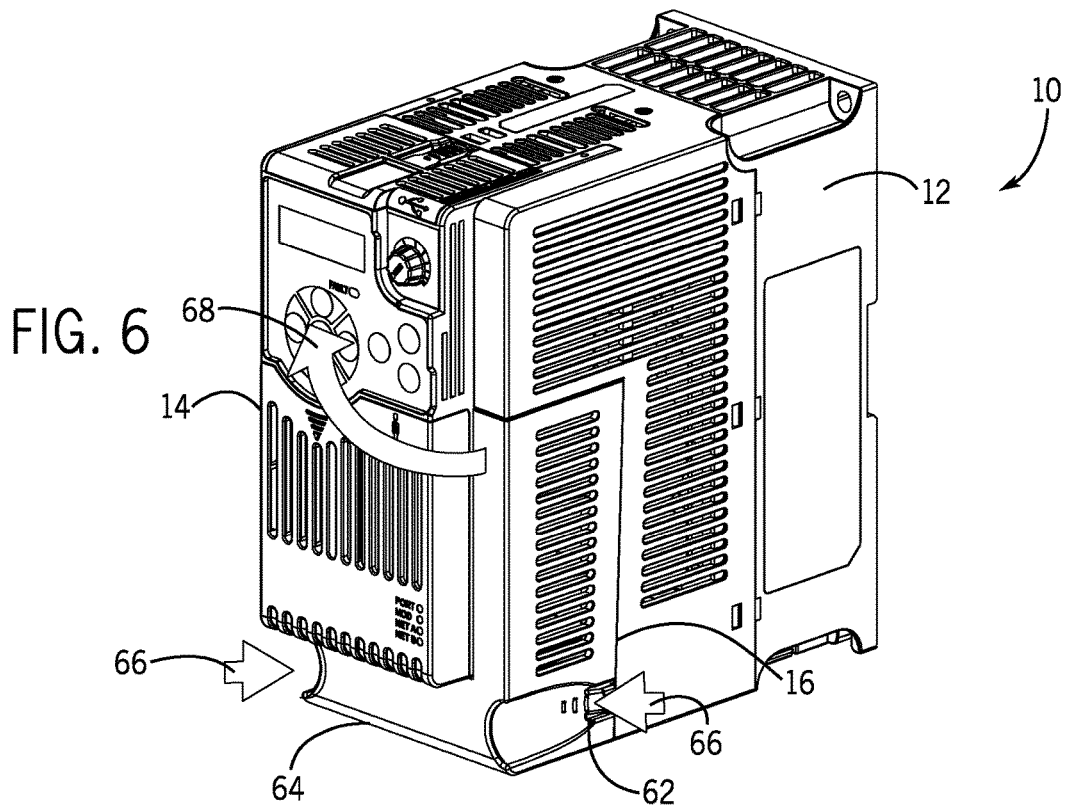
FIG. 6 is a perspective view of an exemplary motor drive system adaptable to install the communication sub-assembly in accordance with aspects of the present techniques.
Figure 7:
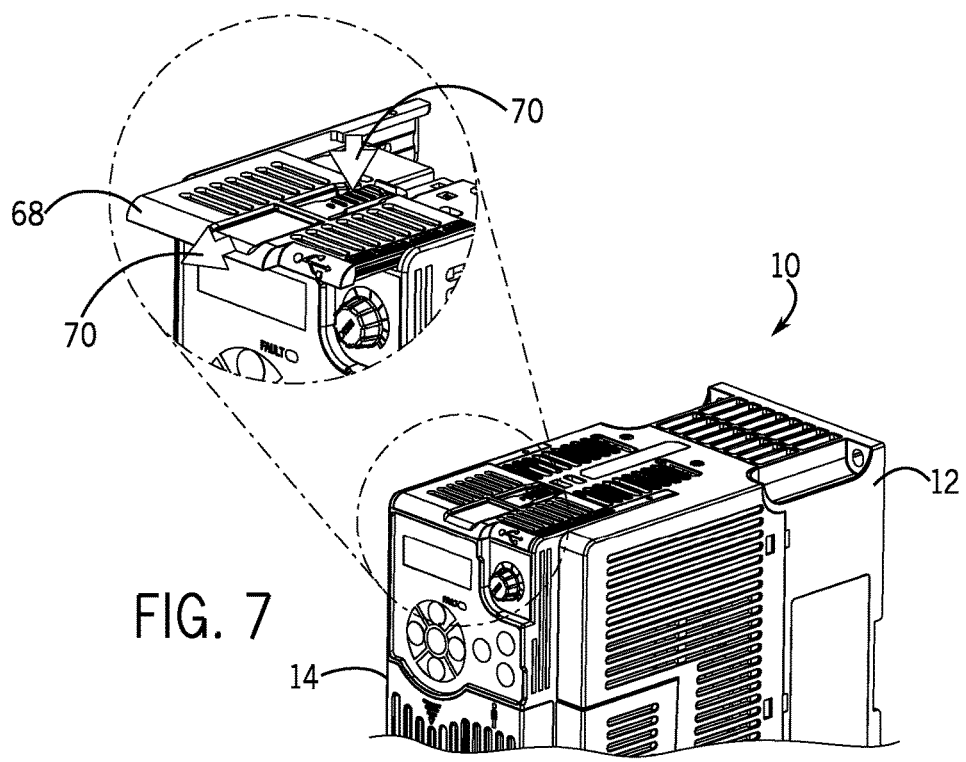
FIG. 7 is a partial perspective view of the system of FIG. 6 with the top cover of the control sub-assembly unlocking the control sub-assembly from the power sub-assembly.

FIG. 6 is a perspective view of an exemplary motor drive system 10 adaptable to install the communication sub-assembly 46 in accordance with aspects of the present techniques. In some embodiments, the motor drive system 10 may be retrofitted to include the communication sub-assembly 46 or the communication sub-assembly 46 may be included during motor drive system assembly. As previously discussed, the motor drive system 10 includes the control sub-assembly 14 connected to the power sub-assembly 12 via mechanical interface 16. To install the communication sub-assembly 46, power may be disconnected from the power sub-assembly 12 and the control sub-assembly 14 is removed from the power sub-assembly 12. As illustrated, catches 62 on both sides of the control sub-assembly frame 64 may be pressed down (arrows 66) and the frame 64 unit may be pulled away from the power sub-assembly 12 and vertically pivoted upwards on a horizontal axis (arrow 68). Additionally, a top cover 68 of the control sub-assembly 14 may be unlocked from the power sub-assembly 12 by pressing down and sliding the top cover 68 away from the power sub-assembly 12 (arrows 70), as shown in FIG. 7.

Figure 8:
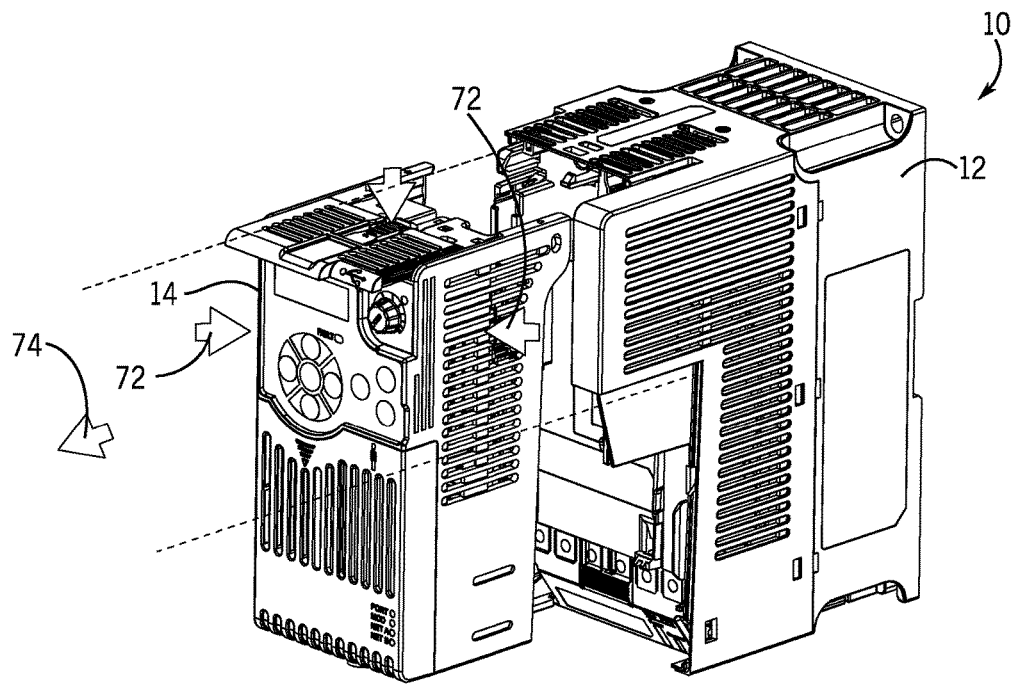
FIG. 8 is a similar perspective view of the system of FIG. 6 with the control sub-assembly removed from the power sub-assembly.

After the control sub-assembly 14 and the power sub-assembly 12 have been detached, the control sub-assembly 14 may be removed from the power sub-assembly 12, as shown in FIG. 8. In some embodiments, after the top cover 68 is unlocked and/or the catches 62 are released, the control sub-assembly 14 is removed by holding its sides firmly (arrows 72) and pulling the control sub-assembly 14 away from the power sub-assembly 12 (arrow 74).

Figure 9:
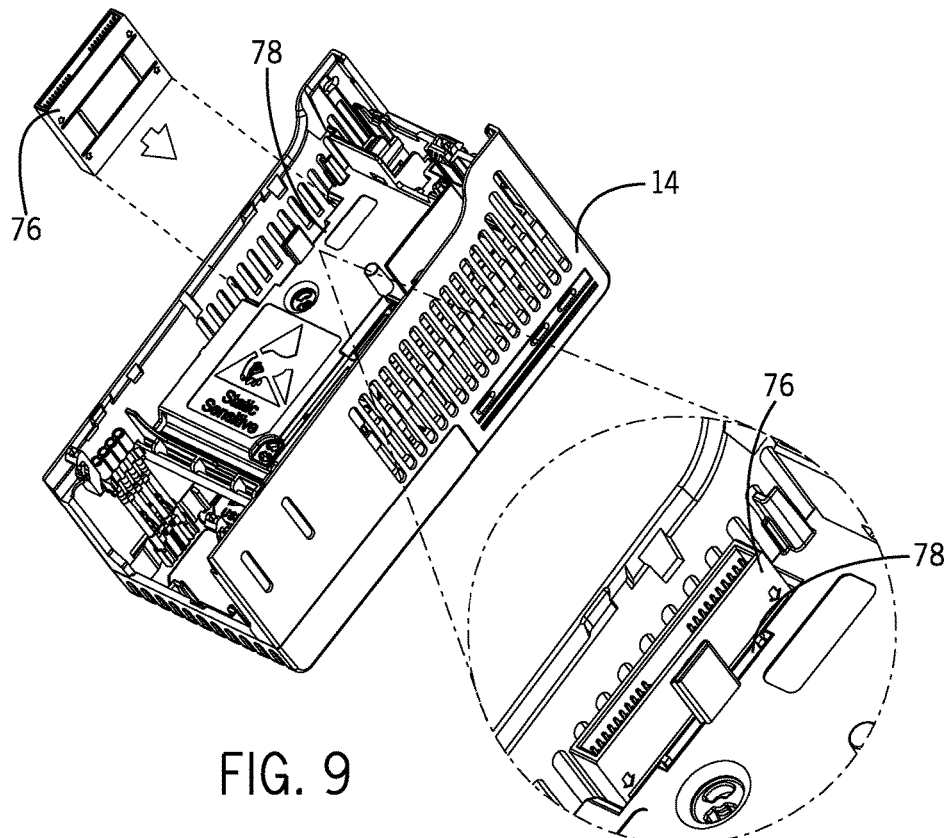
FIG. 9 is a perspective view of inserting an interface connector for the communication sub-assembly into a header located at the back of the control sub-assembly.

FIG. 9 is a perspective view of inserting an interface connector 76 for the communication sub-assembly 46 into a header 78 located at the back of the control sub-assembly 14. The interface connector 76 may enable data to be sent between the communication sub-assembly 46 and the control sub-assembly 14 so that external devices connected to the communication sub-assembly 46 can communicate with the control sub-assembly 14. Also, in some embodiments, the interface connector 76 may aid in securing the communication sub-assembly 46 to the control sub-assembly 14. The interface connector 76 may be secured into the header 78 by pressing the interface connector 76 into the header 78.

Figure 10:
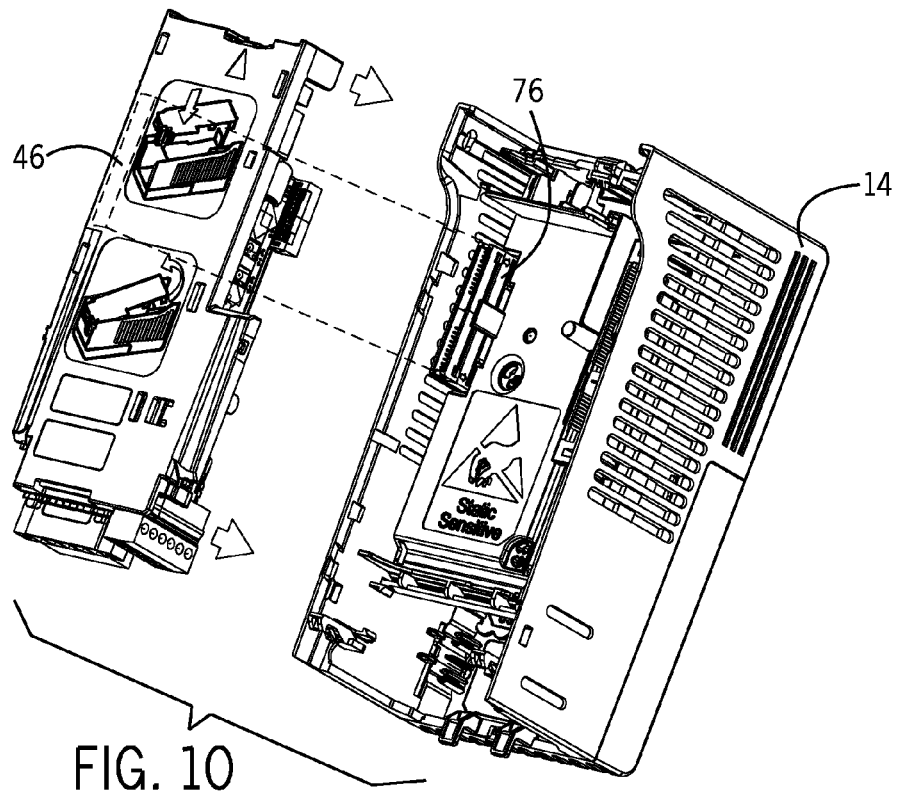
FIG. 10 is a perspective view of installing the communication sub-assembly by aligning it with the interface connector and connecting the two.

Once the interface connector 76 is in place, the communication sub-assembly 46 may be installed, as shown in FIG. 10. FIG. 10 is a perspective view of installing the communication sub-assembly 46 by aligning it with the interface connector 76 of the control sub-assembly 14 and connecting the two. In some embodiments, the communication sub-assembly 46 may be pressed down onto the interface connector 76 until the communication sub-assembly 46 snaps into the back of the control sub-assembly 14. After the communication sub-assembly 46 is installed in the control sub-assembly 14, the power sub-assembly 12 may be reattached to the control sub-assembly 12.

Then, the communication sub-assembly 46 may be connected to the network. In some embodiments, connecting the communication sub-assembly 46 to the network may include connecting a 5-pin linear plug to a network cable (e.g., DeviceNet cable). The 5-pin linear plug may then be inserted into a mating socket of the communication sub-assembly and secured via hardware (e.g., screws). The power may be reconnected and supplied via the power sub-assembly 12. The communication sub-assembly 46 receives its power from the connected control sub-system 14, power sub-assembly 12, and network.

Figure 11:
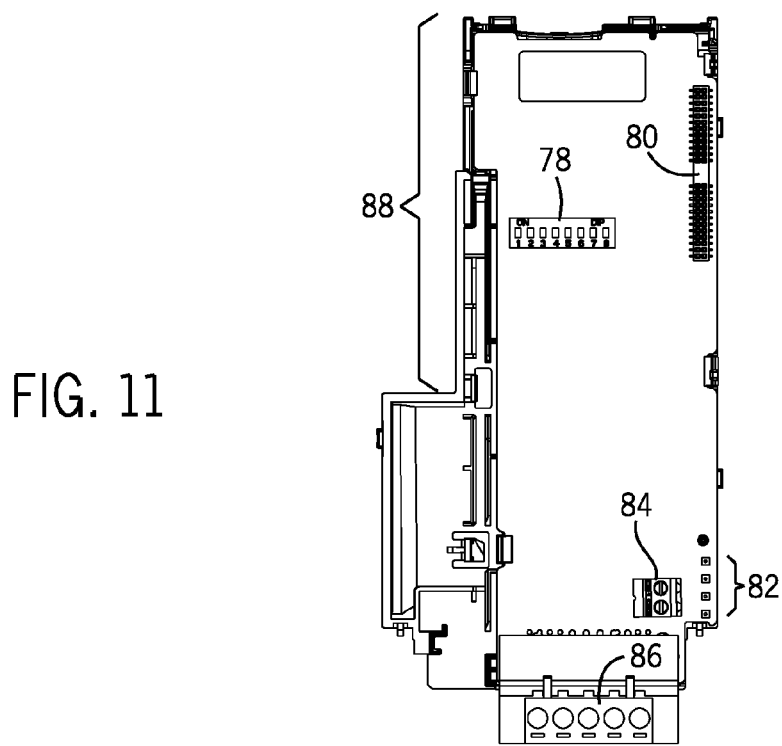
FIG. 11 is a top view of the communication sub-assembly including various components in accordance with an embodiment.

FIG. 11 is a top view of the communication sub-assembly 46 including various components in accordance with an embodiment. As illustrated, the communication sub-assembly 46 includes node address/rate switches 78, a communication card drive header 80, status indicators 82, terminals 84, and a network connector 86. In particular, the node address/rate switches 78 may be used to set the node address and network data rate. The communication card-drive header 80 may include a 40-pin, double-row shrouded female header that is used with the interface connector 76 to connect this header 80 to the header 78 on the drive (e.g., control sub-assembly 14). The status indicators 82 may include three light-emitting diodes (LEDs) that indicate the status of the connected drive, communication sub-assembly 46, and network. In some embodiments, the status indicators 82 display the status through apertures in the front panel of the control sub-assembly 14. Also, the terminals 84 provide a ground for communication bus cable shields. In addition, the network connector 86 may include a 5-pin connector to which a 5-pin linear plug can be connected. However, it should be appreciated that other pin connectors may be used. In some embodiments, the network connector 86 is used to provide access to a DeviceNet, Profibus, EtherNet/IP, and/or Modbus network protocols. As may be seen, the communication sub-assembly 46 includes a groove 88 that is configured to fit around the mating connectors 20 and 22 of the power subassembly 12 and the control subassembly 14 when they are connected. As a result, the communication sub-assembly 46 may be positioned between the power subassembly 12 and the control subassembly 14 when the motor drive system is fully assembled. However, it should be understood, that in some embodiments, the communication sub-assembly 46 is only physically and electrically coupled to the control sub-assembly 14. That is, the communication sub-assembly 46 does not send any data directly to the power sub-assembly 12, nor is the communication sub-assembly physically coupled to the power sub-assembly 12.

Figure 12:
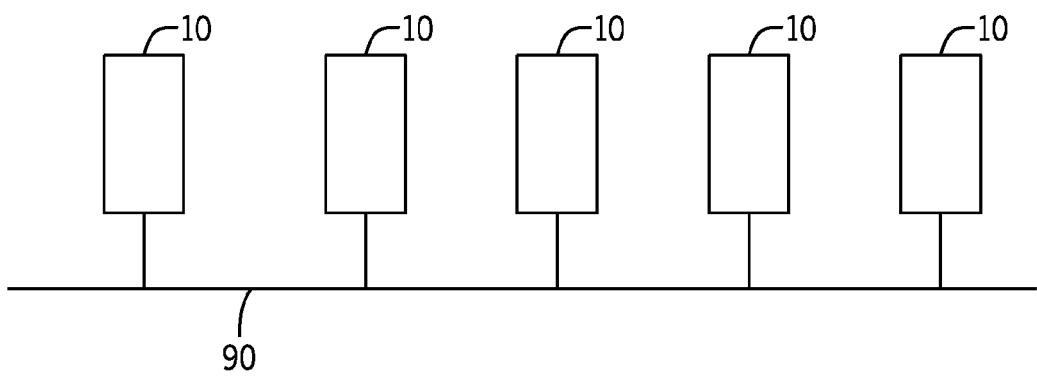
FIG. 12 is an exemplary illustration of a single-drive mode where a single network node consists of a single drive with the communication sub-assembly.

FIG. 12 is an exemplary illustration of a single-drive mode where a single network node consists of a single motor drive system 10 with the communication sub-assembly 46. The high speed drive serial interface (HSDSI) protocol supported by the communication sub-assembly 46 may enable operating in the single-drive mode. The motor drive systems 10 including the communication sub-assembly 46 running in single-drive mode can control and communicate with other drives. As depicted, numerous drive systems 10 (e.g., 5), each representing an individual network node, are connected via a network 90 (e.g., DeviceNet, EtherNet/IP, Profibus, Modbus).

Figure 13:
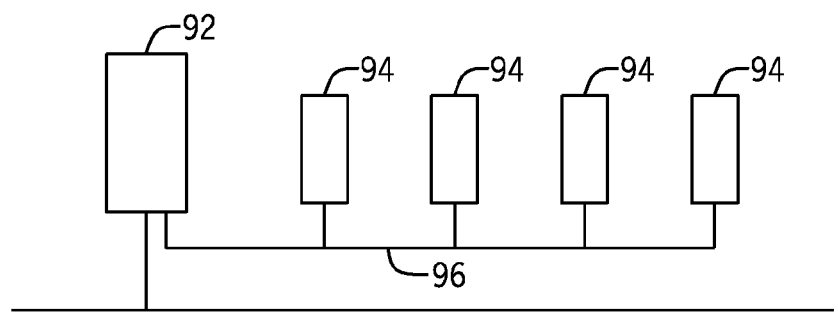
FIG. 13 is an exemplary illustration of a multi-drive mode where a single network node consists of one to five drives where the first drive includes the communication sub-assembly.

The communication sub-assembly operating via the HSDSI protocol also supports a multi-drive operation mode, where HSDSI passes data for up to five drives to the drive containing the communication sub-assembly 46, as shown in FIG. 13. The multi-drive mode depicted shows a single network node 92 consists of one to five drives where the first drive 92 includes the communication sub-assembly 46. The first drive 92 is considered the "master" drive 92 and the connected drives are considered the "slave" drives 94. The slave drives 94 may be daisy-chain connected and may not include the communication sub-assembly 46. The "master" drive 92 may split the information between the drives 94 and forward the information to each individual "slave" drive 94 over a traditional DSI communication bus 96. HSDSI allows for faster communication (3 Mbps vs. 19,200 bps with other systems), provides the user with better information about communication status, and simplifies installation and wiring (in multi-drive mode, communication sub-assembly 46 does not have to be mounted outside of the drives and wired directly to the communication bus between the drives).

Figure 14:
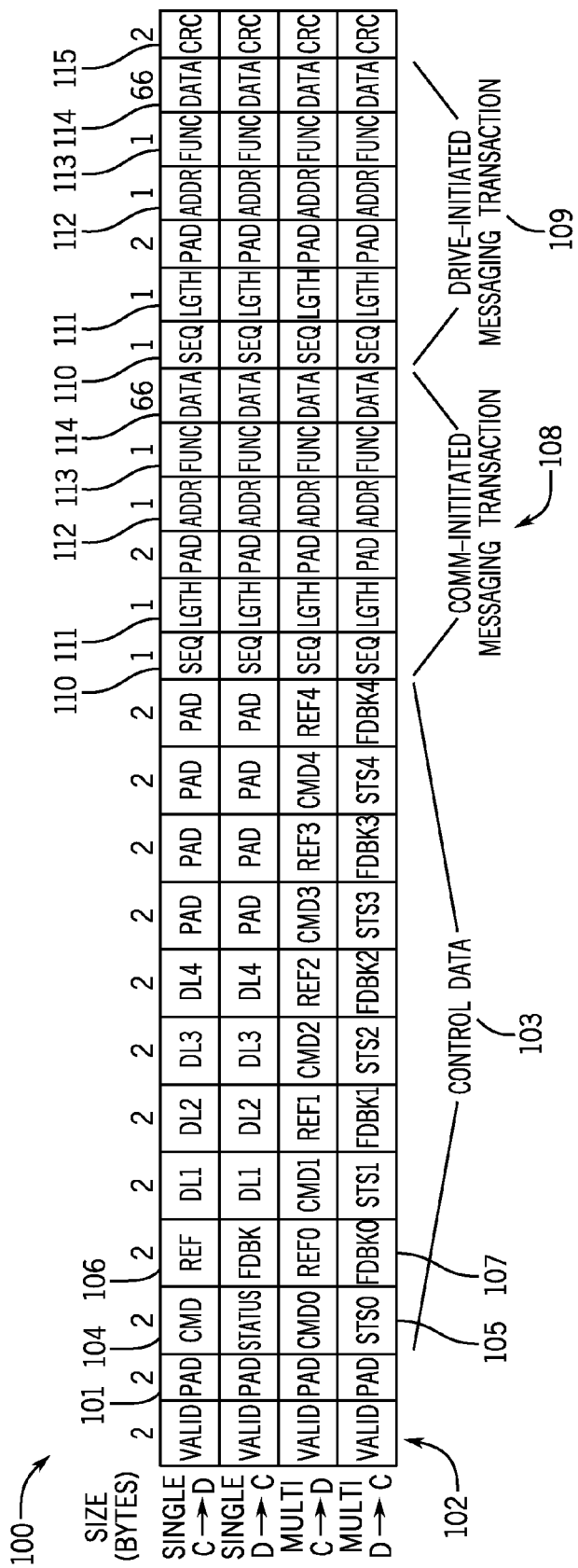
FIG. 14 is a table depicting a HSDSI packet format specification, in accordance with an embodiment.

FIG. 14 is a table depicting a HSDSI packet format specification 100, in accordance with an embodiment. In one embodiment, HSDSI packets are sent at a fixed baud rate of 3 Mbps, with 1 stop bit, 2 stop bits, and no parity. Bits may be sent least significant bit (LSB) first within each byte. As depicted in the specification table 100, C→D indicates communication sub-assembly 46 to drive (control sub-assembly 14), D→C indicates drive to communication sub-assembly 46. "Single" and "multi" in the specification table 100 indicate single vs. multi-drive mode. Byte order of all multi-byte fields is big-endian (most significant byte (MSB) first). Pad 101 words may be sent as zero and ignored on receive. The total packet size is 170 bytes, which takes 0.623 ms to transmit if there are no delays between bytes.

In some embodiments, the "master" of the communication interface is the communication sub-assembly 46. At power-up, the communication sub-assembly 46 transmits the first packet. As soon as the drive finishes receiving that packet and confirms a valid cyclic redundancy check (CRC), the drive transmits its own packet to the communication sub-assembly 46. As soon as the communication sub-assembly 46 finishes receiving that packet and confirms a valid CRC, the communication sub-assembly 46 transmits another packet to the drive. The drive and communication sub-assembly 46 continue exchanging packets in this manner, with low-level and high-level timeout mechanisms available, described below, to reestablish communications in the event of data or synchronization errors or temporary communication losses.

In some embodiments, the drive may not use any data corresponding to a field with its "control valid" bit 102 turned off and neither may the communication sub-assembly 46. The communication sub-assembly 46 may only turn on the control valid bits 102 at the time it actually is taking control of the corresponding data. Discussed below are "control valid" bit 102 field definition and examples.

In a presently contemplated embodiment, while a "lock I/O image" bit is set, the drive may maintain or "lock" the meaning of all fields in the "control data" 103 image, including the parameters pointed to by datalinks, logic command bits (e.g., "lock" the drive into velocity or position mode), and reference values because a network I/O connection is labeling the fields to the user as having the currently configured meaning. The drive may not allow the communication sub-assembly 46 or any other source of configuration changes to change the meaning of any part of the HSDSI "control data" 103 image.

In this embodiment, the lock I/O image bit will only change state when the drive is reset or power cycled. While this bit is off, the drive may ignore any control valid bits and messaging requests received. While this bit is off, the drive may show the port representing the communication sub-assembly 46 as "disabled" to a HIM and software tools, even if a communication sub-assembly 46 is detected in that port. While this bit is off, the drive's message router may provide an error response to any messaging request whose destination is the communication sub-assembly 46, unless a response is necessary to display the port as disabled.

A single-drive I/O bit will only change state when the drive is reset or power cycled. If a "data from net valid" bit for single drive applications or a "logic command/reference to drive valid" bit for multi-drive applications is set, the drive may supply the associated data in this packet to the destination drive. If this bit is cleared, the drive may not use the data. This bit is used in both single and multi-drive modes. In either mode the drive may ignore information from the corresponding fields if this bit is not set. For example, if there is logic command/reference data for multi-drive drop #1, but the bit is not set, that command/reference will not be forwarded to multi-drive drop #1.

For the communication sub-assembly 46 to perform a communication or idle fault action of "fault", the communication sub-assembly 46 sets all five of the valid bits to 0. For the communication sub-assembly 46 to perform other fault actions of "stop", "hold last", "zero data", or "fault config," the communication sub-assembly 46 may continue to set the bits that were already set, and may simply provides the logic command, reference, and datalink data corresponding to the desired fault action, until a running network I/O connection resumes or there is an HSDSI communication loss.

If the control valid bit 102 transitions from set to cleared in single drive mode, the drive may produce an "option card net loss" fault. If the control valid bit 102 transitions from set to cleared, in multi-drive mode, the destination master drive may produce an "option card net loss" fault, and the destination slave drives may produce a "DSI net loss" fault. To forward a fault request to the slave drive, the master drive may enqueue a write message to a destination register of the slave drive that sets its "force comm loss event" bit. Note that this may also be the method used by the master drive to communicate an HSDSI control timeout to the slave drives when operating in multi-drive mode.

A "data link to net valid" bit validity is based upon the datalink selection parameter pointing to a valid parameter. If the communication sub-assembly 46 receives a packet where a datalink being used in its network I/O image is invalid, the communication sub-assembly 46 drops its network I/O connection.

A "logic status/feedback from drive valid" bit that is set in the drive to communication sub-assembly 46 transmissions may indicate that the slave drive is configured and responding properly on a certain network (e.g., Modbus).

The communication sub-assembly 46 may ignore "logic status/feedback valid for drive #0" if drive #0 cannot send valid logic status/feedback that indicates that the HSDSI link has failed, which a timeout will handle. Essentially the HSDSI communication sub-assembly 46 link being valid indicates that the logic status/feedback from drive #0 is valid. If the HSDSI connection is lost, the communication sub-assembly 46 may shut down its network I/O connection, instead of when all multi-drive drops are lost.

If the communication sub-assembly 46 loses the datalink "from net" information from the upstream network, it may continue sending the most recent data for the datalinked parameters, keeping the control valid bit 102 set to 1. If the communication sub-assembly 46 wants the drive to fault then it will set the control valid bit 102 to zero.

Other field definitions included in the specification table 100 include "cmd" 104, which stands for command, "sts" 105, which stands for logic status, "ref" 106, which stands for reference, and "fdbk" 107, which stands for feedback. For multi-drive, the 0 through 4 digits indicate which drive is the source or destination of the control data 103.

For messaging, the comm-initiated transaction portion 108 of the packet contains a place where the communication card can transmit messaging requests, or the drive can transmit responses to the communication card's previous requests. The drive-initiated transaction portion 109 of the packet contains a place where the drive can transmit messaging requests, or the communication card can transmit responses to the drive's previous requests.

Data transmitted in the message buffer remains in the buffer until another transaction occurs. This allows recovery from an error in transmitting or receiving a packet containing a messaging request or response.

For all messaging buffers, "seq" 110 refers to a messaging transaction sequence number. In some embodiments, at power-up and when reestablishing communications after a control timeout occurs, before a message request is available, the sender transmits a zero in "seq" 110 field and all other fields relating to the message request, including the "lgth" 111, "addr" 112, and "func" 113 fields. When a message request is available to transmit, the client device increments its transmitted sequence number (rolling over from 0xFF to 0x01 to avoid reusing 0). The server device may not increment its transmitted sequence number until a response to that particular messaging request is available. Once the response is available, the server device may update its transmitted sequence number to match the client device's sequence number. When the client device receives a matching sequence number, the client device picks up the response to its message.

If at any time either the client device or the server device sees a sequence number of zero, it should abort any messaging transaction in progress at the time, reset its expected sequence number, and echo back a zero for its side of that messaging transaction. This mechanism allows the message originator to communicate a timeout and resynchronize without the risk of reusing the same sequence number as before the timeout.

If at any time either the client device or the server device sees an unexpected sequence number (i.e., not the same sequence number as in the most recently received packet, and not the next number in the sequence accounting for rollover from 0xFF to 0x01), that side should abort any messaging transaction in progress at the time, reset its expected sequence number, and echo back a zero for its side of that messaging transaction. This mechanism allows the two sides to quickly resolve a situation where there is disagreement about the messaging sequence number in use.

If there is a need to retry a message (e.g., after a router's or an application-layer timeout), the retried message receives a new sequence number just as if it were a brand-new messaging transaction.

For all messaging buffers, "lgth" 111 may refer to the total length of the protocol (e.g., Modbus) message in bytes, including the "addr" 112, "func" 113, and "data" 114 fields.

For all messaging buffers, "addr" 112 may refer to the destination address of the messaging transaction. In single drive mode, in some embodiments, this may be 0xF8 for the drive, 0xF9 for the communication sub-assembly 46, and 0xFA for the DSI peripheral. In some embodiments, the address of 0xFC is supported, which represents a common industrial protocol (CIP) virtual port. In multi-drive mode, in some embodiments, this may be either 0 or 0xF8 for the master drive, and 1 through 4 for the slave drives. The master drive may need to translate this address to a protocol (e.g., Modbus) address when forwarding the message over the protocol.

For all messaging buffers, "func" 113 may refer to the protocol (e.g., Modbus) or DSI function code for the messaging transaction. Note that in embodiments using HSDSI, control messages with function codes 0x7B and 0x7C may not be used, since the control data 103 may be placed in another location in the packet.

For all messaging buffers, "data" 114 may be 66 bytes in length, even if the actual protocol (e.g., Modbus) message contains fewer than 66 bytes of data. This keeps the packet size and format constant, enabling the use of DMA-based transmissions and receives and simplifying processing. In some embodiments, the unused portion of the buffer may be populated with 0 values.

In some embodiments, the CRC 115 may include a standard Modbus CRC that covers the entire packet up to the point where the CRC begins (i.e., the preceding 168 bytes).

Figure 15:
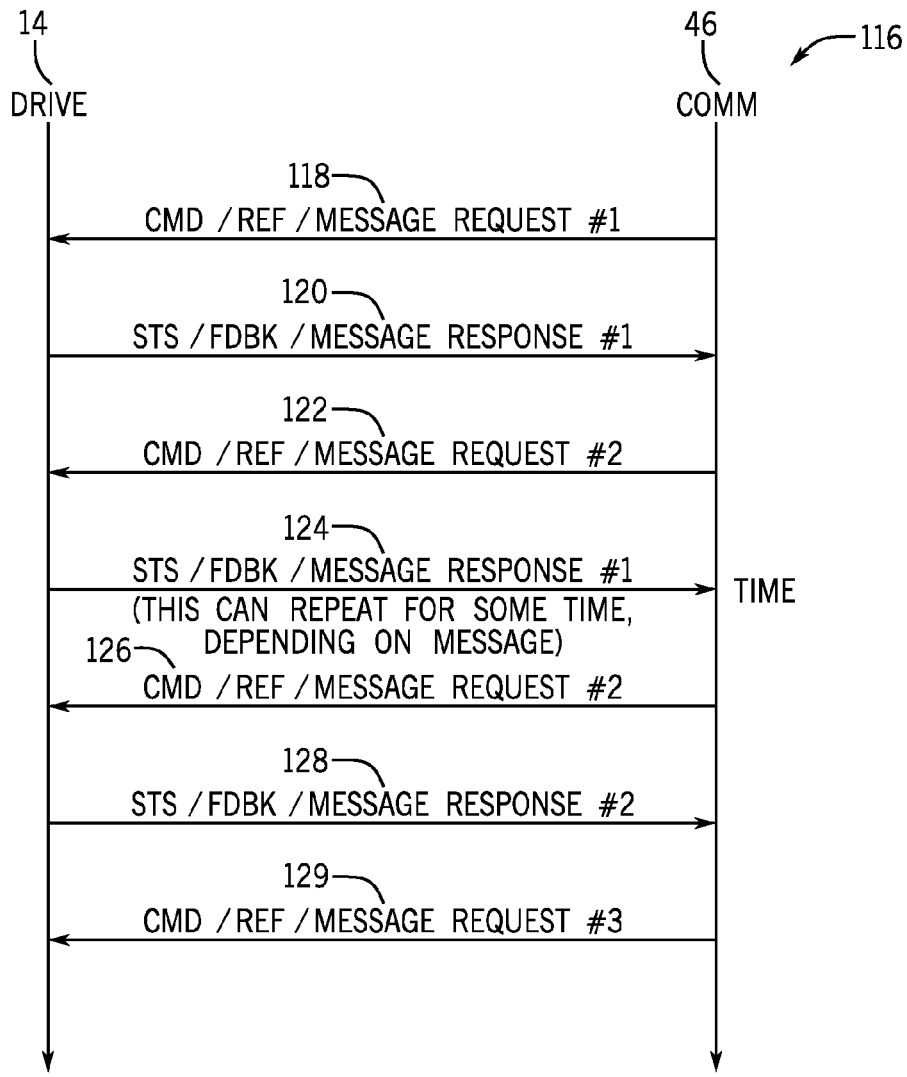
FIG. 15 is a sequence diagram of packet exchanges initiated by the communication sub-assembly.

FIG. 15 is a sequence diagram 116 of packet exchanges initiated by the communication sub-assembly 46 with the drive (control sub-assembly 14). To initiate communication with the drive, the communication sub-assembly 46 may send an initial packet to start up the HSDSI interface without a message request. The initial packet may include all 0 values for seq, lgth, addr, func, and data fields. Since there is no message request from the communication sub-assembly 46, the drive 14 has no response. Then, in event 118 in the sequence diagram 116, the communication sub-assembly 46 may send a first message request requesting to read the drive's number of parameters register. The drive may respond near immediately by sending a response in event 120 indicating its number of parameters. Next, in event 122, the communication sub-assembly 46 sends a second message request to the drive 14. The drive 14 may not have a response ready yet so it responds with the data from the first response (event 124). This cycle may continue for some time until the response to the message request is available. For example, in event 126, the communication sub-assembly 46 repeats the second message request to the drive 14 and the drive responds with a second response including the requested data (event 128). Then, in event 129, the communication sub-assembly 46 may send a third request and the sequence may continue.

Figure 16:
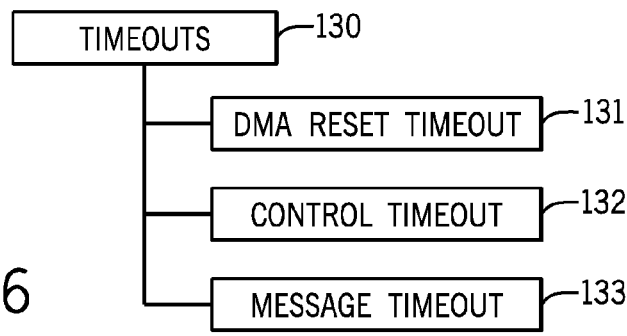
FIG. 16 is a schematic diagram of timeouts used by the control sub-assembly and the communication sub-assembly.

FIG. 16 is a schematic diagram of timeouts 130 used by the control sub-assembly 14 and the communication sub-assembly 46. The timeouts 130 may include a DMA reset timeout 131, a control timeout 132, and a message timeout 133. Both the control sub-assembly 14 (drive) and the communication sub-assembly 46 may utilize the three HSDSI related timeout functionalities.

The DMA reset timeout 131 may be a low level timeout that simply keeps track of the health of the HSDSI connection; its timeout action may be to reset the DMA to allow for attempts at re-syncing the HSDSI connection. The control timeout 132 may only be active once valid I/O has been received through HSDSI, and will cause a drive fault indicating the loss of the HSDSI connection. The message timeout 133 may monitor the DSI messaging time and attempt to inhibit degenerate messaging cases from clogging/breaking the DSI message router.

Diagnostic counters for the number of times that each of the types of timeouts have occurred may be used. Suggested names are "DMA Timeout Cnt", "Ctl Timeout Cnt", and "Msg Timeout Cnt".

On the control sub-assembly 14 (drive) side, the DMA reset timeout 131 may be used to ensure that the low level HSDSI communication interface is operating correctly, and that both sides are still in sync. This is used because of the functionality of the DMA. In some embodiments, one way to recover from a drive-option HSDSI protocol breakdown is to completely reset and reinitialize the DMA. This timeout 131 may hinge upon receiving packets with valid CRCs. If no packet with a valid CRC is received in a configurable amount of time (e.g., 25 ms) duration the drive's DMA will be reset. The drive may then wait for the communication sub-assembly 46 to reinitiate the HSDSI communications with the same or an updated message that the communication sub-assembly 46 was attempting to send before the timeout.

The control timeout 132 may be started when an HSDSI packet with a valid CRC is received by the drive. If a certain amount of time (e.g., 100 ms) passes and no packet with a valid CRC is received then the drive may log an HSDSI communication fault. The drive may also stop sending and processing received packets for a period of time (e.g., at least 100 ms) to force the communication sub-assembly 46 to recognize its own control timeout. Then, the communication sub-assembly 46 may reinitialize the interface as it does at power-up, including setting both message sequence count fields back to zero. The drive may also enqueue network loss fault messages to the multi-drive drops. Note that, in some embodiments, the slave drives may show a DSI net loss fault. The control timeout period may allow the DMA reset timeout 131 at least two attempts to reset and restart HSDSI communications.

A messaging timeout 133 may attempt to inhibit the DSI router from hanging in an event where a message query makes it to the router, but the response never gets formed. This timeout 138 may monitor the amount of time that any router is in a busy state. In some embodiments, if any router is busy for one second or longer, the source and destination routers for that query will be reset to their idle state, and the portion of the drive 14 firmware that initiated the message will be informed of the timeout error so that it can pass the error message back to the originator.

Turning to the timeouts used by the communication sub-assembly 46, since the communication sub-assembly 46 is the master of the interface in some embodiments, the communication sub-assembly 46 is responsible for initiating communications with the drive 14. Once the communication sub-assembly 46 is ready to initialize the HSDSI interface, it sends an HSDSI packet to the drive, even if there is no control or messaging data ready at that time. The communication sub-assembly 46 will send packets to the drive at least within a minimum rate to assure the health of the interface even if there is not an I/O connection active. Once there is control data 103 to be sent, the communication sub-assembly 46 may send the most recent command/reference.

The communication sub-assembly 46 has a similar low level timeout 131 to the drive that resets the DMA, re-initializes the HSDSI communications, and begins transmitting a packet to the drive, if no packets with a valid CRC have been received within the timeout period. In some embodiments, a different timeout period than the drive 14 may be used to avoid both devices continuously resetting in phase with each other.

The communication sub-assembly 46 also has a control timeout 132 of a configurable amount of time (e.g., 100 ms), similar to the drive. If the communication sub-assembly 46 has started receiving control data 103 with one or more control valid bits set, and either a future received packet has a control valid bit transitioning from set to clear or 100 ms goes by without receipt of another packet, the communication sub-assembly 46 may declare a control timeout 130. It may stop sending and processing received packets for at least 100 ms to force the drive to recognize its own control timeout, then clears its control data 103 valid bits 102 and reinitializes the interface as it does at power-up, including setting both message sequence count fields back to zero. The communication sub-assembly 46 should also take the appropriate action on its network interface, for example dropping the network I/O connection, if there is an HSDSI communication loss.

The communication sub-assembly 46 messaging client may implement a messaging timeout 133 to inhibit the messaging client from hanging due to not receiving a response to a message it has sent. This timeout 133 may monitor the amount of time since the messaging request was first transmitted, and continues until a matching response is received. In some embodiments, if the message is pending for one second or longer, the communication sub-assembly 46 sets the communication sub-assembly-originated message sequence number to zero to indicate to the drive 14 that the messaging request is being aborted. The portion of the communication sub-assembly 46 firmware that initiated the message will be informed of the timeout 133 error so that it can pass the error message back to the originator.

Figure 17:
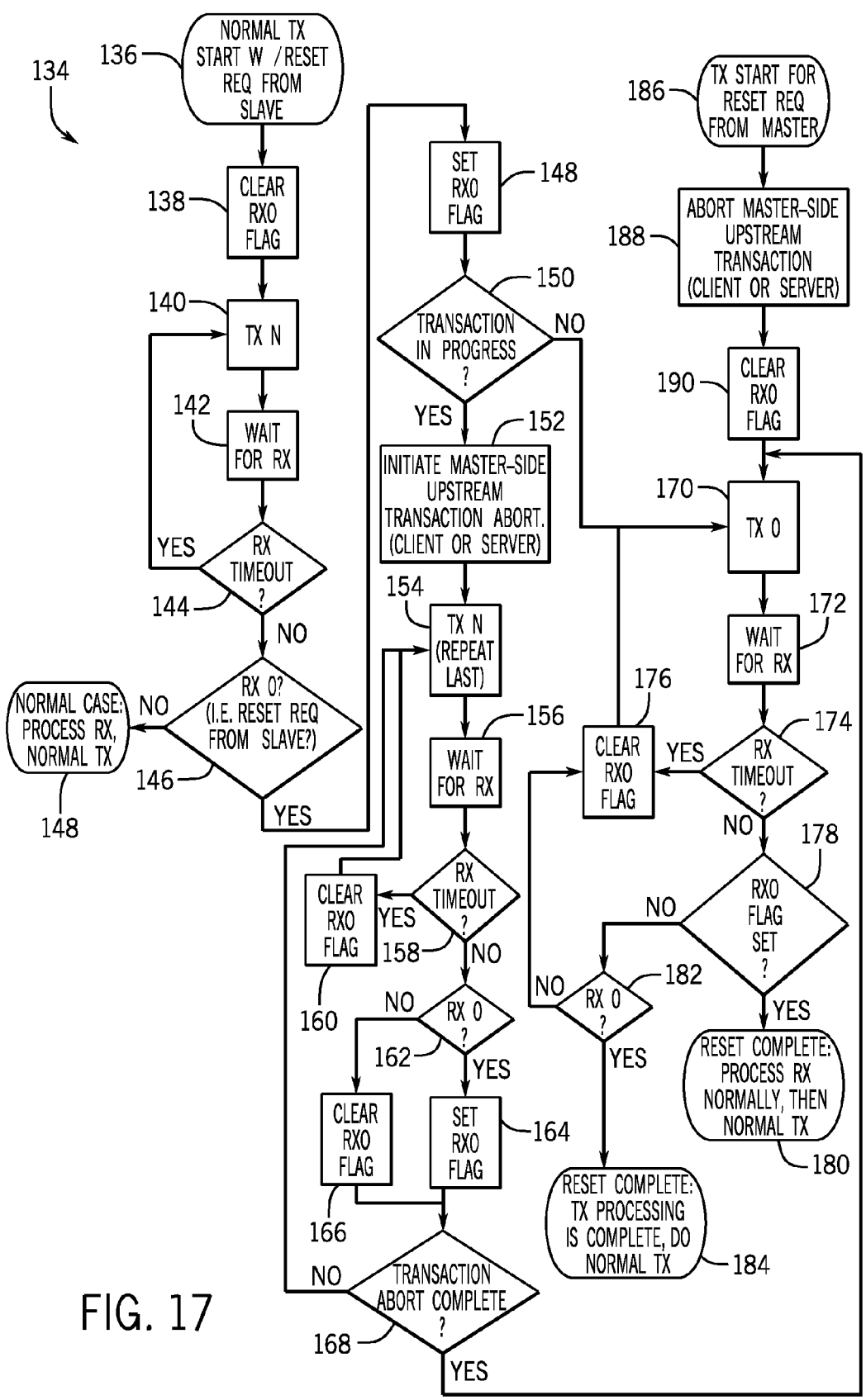
FIG. 17 is a flow diagram of a process for a messaging reset sequence initiated by the communication sub-assembly.
Figure 18:
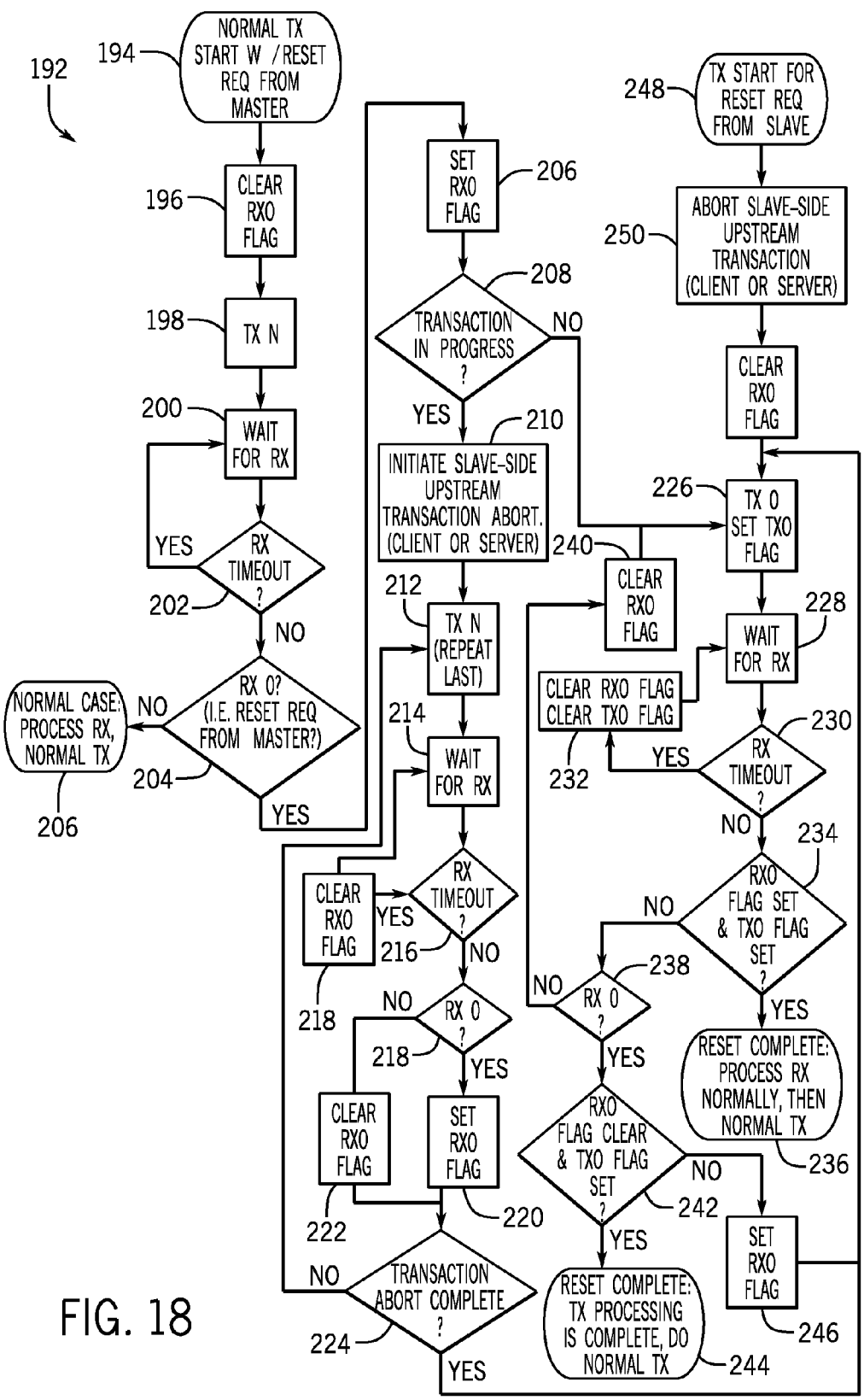
FIG. 18 is a flow diagram of a process for a messaging reset sequence initiated by the control sub-assembly.

FIG. 17 is a flow diagram of a process 134 for a messaging reset sequence initiated by the communication sub-assembly 46 and FIG. 18 is a flow diagram of a process 192 for a messaging reset sequence initiated by the control sub-assembly 14. It should be noted that the HSDSI interface defines two messaging channels: option card-initiated and drive-initiated (e.g., communication sub-assembly-initiated and control sub-assembly-initiated). The two channels can be reset independently of each other, although lost HSDSI messages (DMA timeout) may apply to both channels simultaneously. The option card (e.g., communication sub-assembly 46) is assumed to be the HSDSI master, and the drive (e.g., control sub-assembly 14) is the HSDSI slave. In some embodiments, the main difference between the master and the slave is that the master always transmits a duplicate of the previous transmitted message immediately following a low level receive timeout (e.g., DMA timeout), whereas such a timeout causes the slave to simply reset its receive process, wait for another HSDSI message, and then respond.

A messaging channel can be reset from either side. When one side (i.e., master or slave) wants to reset a messaging channel, it first aborts any upstream transaction that might be in progress on its own side then sends an HSDSI message with the message sequence number in the appropriate messaging segment set to 0. The other side is expected to respond to the reception of the 0 message sequence number by aborting its own upstream transaction and sending a reply message also with a message sequence number of 0. In some embodiments, the 0 message sequence number is only used for channel reset, and it is not used during normal transactions.

In some embodiments, the two messaging channels may be handled identically on each side. However, the handling on the slave side can differ from the handling on the master side. Also, when one side of the channel is reset from the other side, it may send a response HSDSI message before the abort of its upstream transaction can be completed. Therefore, the reset scheme may support multiple message exchanges between the initial 0 message sequence number transmitted by the side requesting the reset and the 0 message sequence number response transmitted by the other side. At the end of the channel reset process, either side may transmit a new messaging request (i.e., change the outgoing message sequence number from 0 to 1). For each channel, one side (the client side) will actually transmit such a request, but the channel reset protocol works either way.

The reset process may be completed on one side after one of the following sequences occurs:

a.
Receive Message Sequence Number==0 without a receive timeout.
Transmit Message Sequence Number=0
Receive another message without a receive timeout. This message is processed as a normal incoming message, and the received Message Sequence Number is not necessarily 0.

b.
Transmit Message Sequence Number=0
Receive Message Sequence Number==0 without a receive timeout.

The following flow diagrams in FIGS. 17 and 18 start at the point where one side of the messaging channel is ready to transmit a new message. There are two entry points for each flow diagram: one for normal transmits, and the other for the case where the side doing the transmit wants to command a reset of the channel. The flow diagrams do not give details about the handling of "normal" messages.

It should be noted that, in the flow diagrams, "TX 0" means "Transmit an HSDSI message containing a message sequence number of 0 in the appropriate messaging segment". "TX n" means "Transmit an HSDSI message that does not contain a message sequence number of 0 in the appropriate segment". It should be apparent from context whether the outgoing segment should be an exact duplicate of the previous outgoing segment. "RX 0?" means "did the HSDSI message just received contain a message sequence number of 0 in the appropriate messaging segment." "RX0 Flag" and "TX0 Flag" are global variables used for the scheme. "RX Timeout" is the low level receive timeout on the entire HSDSI message (also known as "DMA timeout 131"). The timeout 131 may apply to both messaging channels simultaneously.

Beginning first with FIG. 17, which includes the flow diagram illustrating the option card-initiated message reset sequence, and focusing on the entry point 136 where the master is performing normal transmissions, the process 134 includes the communication sub-assembly 46 clearing the response message sequence number set to 0 flag (process block 138) and transmitting an HSDSI message that does not contain a message sequence number of 0 in the appropriate segment (process block 140). The communication sub-assembly 46 then waits for to receive an HSDSI response (process block 142) and determines whether there is a DMA timeout 131 (decision block 144). If there is a timeout, then the process 134 returns to transmitting an HSDSI message that does not contain a message sequence number of 0 in the appropriate segment (process block 140). If there is not a timeout, then the process 134 includes determining whether the HSDSI message just received contains a message sequence number of 0 in the appropriate messaging segment (decision block 146). If not, then the process 134 includes a normal case and process the response and sends another normal transmission by starting at point 136 again. If response message sequence number is set to 0, then the process includes setting the response message sequence number 0 flag in process block 148. Then, the process 134 includes determining whether there is a transaction in progress (decision block 150).

If there is a transaction in progress, then the process 134 includes initiating master-side upstream transaction abort (process block 152) and transmitting the last HSDSI message that does not contain a message sequence number of 0 in the appropriate segment (process block 154). Next, the process 134 includes waiting for the response (process block 156) and determining whether there is a DMA timeout (decision block 158). If there is a timeout, then the response message sequence number 0 flag is cleared (process block 160) and the process 134 returns to transmitting the last HSDSI message that does not contain a message sequence number of 0 in the appropriate segment (process block 154). If there is not a timeout, a decision is made whether the HSDSI message just received contain a message sequence number of 0 in the appropriate messaging segment (decision block 162). If so, then the response message sequence number 0 flag is set (process block 164) and, if not, then the response message sequence number 0 flag is cleared (process block 166). Either way, the process 134 continues to determine whether the transaction abort is complete (decision block 168). If it is not complete, then the process 134 returns to transmitting the last HSDSI message that does not contain a message sequence number of 0 in the appropriate segment (process block 154). If the transaction abort is complete, then the process 134 transmits an HSDSI message containing a message sequence number of 0 in the appropriate messaging segment (process block 170). Then, the process 134 waits for a response (process block 172) and determines whether there is a DMA timeout 131 (decision block 174). If there is a timeout, the response message sequence number 0 flag is cleared (process block 176), and then the process 134 transmits an HSDSI message containing a message sequence number of 0 in the appropriate messaging segment (process block 170), and the process continues from block 170. If there is not a timeout, then the process 134 determines whether the response message sequence number 0 flag is set (decision block 178). If so, the reset is complete and the response is processed normally, then the process 134 returns to normal transmission at point 136. If not, a determination is made whether the HSDSI message just received contain a message sequence number of 0 in the appropriate messaging segment (decision block 182). If so, the reset is complete and response processing is complete, so the process 134 returns to normal transmission at point 136 (process block 184). If not, the process 134 clears the response message sequence number 0 flag at process block 176 and continues processing back to process block 170.

If there is not a transaction in progress, the process 134 transmits an HSDSI message containing a message sequence number of 0 in the appropriate messaging segment (process block 170) and continues to process block 172, as described above.

Starting from the entry point 186 where the master sends the reset request, the process 134 aborts the master-side upstream transaction (client or server) (process block 188). Then, the response message sequence number 0 flag is cleared (process block 190). The process 134 transmits an HSDSI message containing a message sequence number of 0 in the appropriate messaging segment (process block 170) and continues to process block 172, as described above.

FIG. 18 illustrates the flow diagram of a process 192 for the slave side (control sub-assembly 14, referred to as drive below) initiated message reset sequence. Starting at entry point 194 where the slave and master are performing normal transmissions, the process 192 includes the drive clearing the received message sequence number set to 0 flag (process block 196) and transmitting an HSDSI message that does not contain a message sequence number of 0 in the appropriate segment (process block 198). The drive then waits to receive an HSDSI response (process block 200) and determines whether there is a DMA timeout 131 (decision block 202). If there is a timeout, then the process 192 returns to transmitting an HSDSI message that does not contain a message sequence number of 0 in the appropriate segment (process block 200). If there is not a timeout, then the process 192 includes determining whether the HSDSI message just received contains a message sequence number of 0 in the appropriate messaging segment (decision block 204). If not, then the process 192 includes a normal case and processes the response and sends another normal transmission by starting at point 194 again. If message sequence number is set to 0, then the process includes setting the response message sequence number to 0 flag in process block 206. Then, the process 192 includes determining whether there is a transaction in progress (decision block 208).

If there is a transaction in progress, then the process 192 includes initiating slave-side upstream transaction abort (process block 210) and transmitting the last HSDSI message that does not contain a message sequence number of 0 in the appropriate segment (process block 212). Next, the process 192 includes waiting for the response (process block 214) and determining whether there is a DMA timeout (decision block 216). If there is a timeout, then the response message sequence number 0 flag is cleared (process block 218) and the process 192 returns to waiting for the response (process block 214). If there is not a timeout, a decision is made whether the HSDSI message just received contain a message sequence number of 0 in the appropriate messaging segment (decision block 218). If so, then the response message sequence number 0 flag is set (process block 220) and, if not, then the response message sequence number 0 flag is cleared (process block 222). Either way, the process 192 continues to determine whether the transaction abort is complete (decision block 224). If it is not complete, then the process returns to transmitting the last HSDSI message that does not contain a message sequence number of 0 in the appropriate segment (process block 212) and the process 192 continues accordingly, as described above. If the transaction abort is complete then the process 192 sets the transmission message sequence number 0 flag and transmits an HSDSI message containing a message sequence number of 0 in the appropriate messaging segment (process block 226). Then, the process 192 waits for a response (process block 228) and determines whether there is a DMA timeout (decision block 230). If there is a timeout, the response message sequence number 0 flag is cleared, the transmission message sequence number 0 flag is cleared (process block 232), and then the process 192 returns to waiting for a response (process block 228). If there is not a timeout, then the process 192 determines whether the response message sequence number 0 flag is set and whether the transmission message sequence number 0 flag is set (decision block 234). If so the reset is complete at point 236 and the response is processed normally, then the process 192 returns to normal transmission at point 194. If not, a determination is made whether the HSDSI message just received contain a message sequence number of 0 in the appropriate messaging segment (decision block 238). If not, the response message sequence number 0 flag is cleared (process block 240) and the process 192 returns to process block 226 and continues to process accordingly, as described above. If the HSDSI message just received does contain a message sequence number of 0 in the appropriate messaging segment, then a determination is made whether the response message sequence number 0 flag is clear and the transmission message sequence number 0 flag is set (decision block 242). If so, then the reset is complete at point 244 and received message processing is complete and the process 192 returns to normal transmission at point 194. If not, the response message sequence number 0 flag is set (process block 246) and the process 192 returns to process block 226 to continue processing accordingly, as described above.

If there is not a transaction in progress, the process 192 sets the transmission message sequence number 0 flag and transmits an HSDSI message containing a message sequence number of 0 in the appropriate messaging segment and (process block 226) and continues to process block 228, as described above.

Starting from the entry point 248 where the slave sends the reset request, the process 192 aborts the slave-side upstream transaction (client or server) (process block 250). Then, the response message sequence number 0 flag is cleared (process block 252). The process 192 sets the transmission sequence message number 0 flag, transmits an HSDSI message containing a message sequence number of 0 in the appropriate messaging segment (process block 226), and continues to process block 228, as described above.

To further describe how the communication sub-assembly 46 uses the HSDSI protocol, the discussion now focuses on startup and login handling. At startup, in some embodiments, the communication sub-assembly 46 is expected to send one HSDSI packet with no control valid bits set and containing no message request. The response from the drive 14 to that packet may contain the "interface enabled" bit for the communication sub-assembly 46 to check its state. If the "interface enabled" bit is off, the communication sub-assembly 46 may not send further packets. The communication sub-assembly 46 may continue to send packets (e.g., at intervals longer than when communications are active, but usually not longer than a period of time (100 ms) to avoid missing a drive reset) so that the communication sub-assembly 46 may detect when the drive resets, and then attempt to reestablish communications. After login on HSDSI, a network I/O connection to the communication sub-assembly 46 may not be present. When the network connection opens at a later time, the communication sub-assembly 46 may set the appropriate control valid bits and begins forwarding the control data 103 to the drive.

Focusing now on updating the firmware, software, or some combination thereof (referred to as "flashing"), in multi-drive mode, the ability to flash either the master or any slave drive may not be present. To accomplish this, communication sub-assemblies 46 may not present CIP identity instances for multi-drive drives on the network interface 50. In some embodiments, while the communication sub-assembly 46 is being flashed over its network connection, the HSDSI connection may be dropped. The resulting drive fault may be expected. In some embodiments, while the drive 14 is being flashed through embedded Ethernet or DSI, the HSDSI connection may also be dropped. While the drive 14 is being flashed through the communication option, HSDSI may stay online. An active flash update is signified by the fact that a flash message (function 0x63) is the active messaging transaction being sent between devices. When the drive 14 sees the first flash message, the drive 14 may generate a net loss fault if the drive was receiving any control data from the control sub-assembly 46.

While processing a flash message, both messaging 133 and control 132 timeouts may be suspended. DMA reset timeout 131 periods may be relaxed to account for flash programs and erases. That is, the DMA timeout 131 may be suspended during flash programming operations and restart or continue when done accessing the flash chip.

At the end of a flash update, the drive 14 and communication sub-assembly 46 may either explicitly reset, or the control timeout 132 may resume after no flash messages have been sent for some time, and the control timeout 132 may cause both devices to reinitialize and reestablish HSDSI communications.

While only certain features of the present techniques have been illustrated and described herein, many modifications and changes will occur to those skilled in the art. It is, therefore, to be understood that the appended claims are intended to cover all such modifications and changes as fall within the true spirit of the present disclosure.

The invention claimed is:
1. A motor drive system comprising:
   a modular power subassembly controllable to provide controlled frequency AC power to an electric motor;
   a modular control subassembly separable from the modular power subassembly that, in operation, applies con- trol signals to the modular power subassembly for controlling the provided power; and an add-on communication subassembly positionable between the modular power subassembly and the modular control subassembly, comprising a component physically separate from the modular control subassembly, and electrically coupled to the modular control subassembly for providing communication between the modular control subassembly and at least one external device when the modular control subassembly is secured to the modular power subassembly and the add-on communication subassembly is coupled to the modular control subassembly.

2. The system of claim 1, wherein the modular power and control subassemblies comprise mating multi-conductor connectors that mate when the modular control subassembly is attached to the modular power subassembly to convey signals between the modular power and control subassemblies.

3. The system of claim 2, wherein the add-on communication subassembly is configured to fit around the mating multi-conductor connectors when the modular control subassembly is attached to the modular power subassembly.

4. The system of claim 1, wherein the add-on communication subassembly is attached to the modular control subassembly prior to mating the modular control subassembly with the modular power subassembly.

5. The system of claim 1, comprising an adapter connector for connecting the add-on communication subassembly to the modular control subassembly.

6. The system of claim 1, wherein the add-on communication subassembly is not electrically coupled to the modular power subassembly and does not directly convey signals with the modular power subassembly.

7. The system of claim 1, wherein the add-on communication subassembly receives power from a connected network, the modular control subassembly that is connected to the modular power subassembly, or some combination thereof.

8. The system of claim 1, wherein the add-on communication subassembly comprises status indicators configured to display a status of the add-on communication subassembly, the modular control subassembly, network communications, or some combination thereof, through apertures in a front panel of the modular control subassembly.

9. The system of claim 1, wherein the add-on communication subassembly comprises a communications module configured to communicate with the at least one external device via EtherNet/IP.

10. A motor drive system comprising:
an add-on communication subassembly configured to be positioned between a modular control subassembly and a modular power subassembly of the motor drive system and comprising a component physically separate from the modular control subassembly, wherein the add-on communication subassembly is electrically coupled to the modular control subassembly and provides communication between the modular control subassembly and external devices when the modular control subassembly is secured to the modular power subassembly and the add-on communication subassembly is coupled to the modular control subassembly.

11. The system of claim 10, wherein the add-on communication subassembly is physically mounted to the modular control subassembly between the modular power subassembly and the modular control subassembly.

12. The system of claim 10, wherein the modular power and control subassemblies comprise mating multi-conductor connectors that mate when the modular control subassembly is attached to the modular power subassembly to convey signals between the modular power and control subassemblies.

13. The system of claim 12, wherein the add-on communication subassembly is configured to fit around the mating multi-conductor connectors when the modular control subassembly is attached to the modular power subassembly.

14. The system of claim 10, comprising an adapter connector for connecting the add-on communication subassembly to the modular control subassembly.

15. The system of claim 10, wherein the add-on communication subassembly receives power from a connected network, the modular control subassembly that is connected to the modular power subassembly, or some combination thereof.

16. The system of claim 10, wherein the add-on communication subassembly comprises status indicators configured to display a status of the add-on communication subassembly, the modular control subassembly, network communications, or some combination thereof, through apertures in a front panel of the modular control subassembly.

17. A motor drive system, comprising:
a modular power subassembly controllable to provide controlled frequency alternating current power to an electric motor;
a modular control subassembly separable from the modular power subassembly and that, in operation, applies control signals to the modular power subassembly for controlling the provided power via a first mating connector of the modular power subassembly connected to a second mating connector of the modular control subassembly; and
an add-on communication subassembly comprising a component physically separate from the modular control subassembly and only physically coupled and electrically coupled to the modular control subassembly for providing communication between the modular control subassembly and at least one external device when the modular control subassembly is secured to the modular power subassembly and the add-on subassembly is coupled to the modular control subassembly, wherein the add-on communication subassembly is configured to fit around the mated first and second mating connectors when the modular control assembly and the modular power subassembly are attached so that the communication subassembly is positioned between the modular control subassembly and the modular power subassembly.

18. The system of claim 17, comprising an adapter connector for connecting the add-on communication subassembly to the modular control subassembly.

19. The system of claim 18, wherein the add-on communication subassembly comprises node address/rate switches configured to set a node address and network data rates, a communication card drive header configured to attach to the adapter connector, status indicators configured to display a status of the communication subassembly, the modular control subassembly, network communications, or some combination thereof, and a network connector configured to provide access to one or more network protocols.

20. The system of claim 17, wherein the add-on communication subassembly is configured to convey control and message data between the modular control subassembly and the at least one external device.

* * * * *